United States Patent
Ojima

(10) Patent No.: US 10,153,174 B2
(45) Date of Patent: Dec. 11, 2018

(54) METHOD OF MANUFACTURING SEMICONDUCTOR DEVICE

(71) Applicant: TOSHIBA MEMORY CORPORATION, Tokyo (JP)

(72) Inventor: Tomoko Ojima, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 771 days.

(21) Appl. No.: 14/641,928

(22) Filed: Mar. 9, 2015

(65) Prior Publication Data

US 2016/0079082 A1 Mar. 17, 2016

(30) Foreign Application Priority Data

Sep. 11, 2014 (JP) ................................. 2014-185304

(51) Int. Cl.
| | |
|---|---|
| *H01L 21/00* | (2006.01) |
| *H01L 21/311* | (2006.01) |
| *H01L 21/027* | (2006.01) |
| *G03F 7/00* | (2006.01) |

(52) U.S. Cl.
CPC ...... *H01L 21/31144* (2013.01); *G03F 7/0002* (2013.01); *H01L 21/0271* (2013.01)

(58) Field of Classification Search
CPC .............. G08F 7/0002; H01L 21/0271; H01L 21/31144
USPC ......................................................... 427/58
See application file for complete search history.

(56) References Cited

U.S. PATENT DOCUMENTS

| | | | | |
|---|---|---|---|---|
| 8,105,952 | B2 * | 1/2012 | Kihara | B82Y 10/00 |
| | | | | 438/705 |
| 2008/0193658 | A1 * | 8/2008 | Millward | B81C 1/00031 |
| | | | | 427/401 |
| 2009/0001045 | A1 * | 1/2009 | Chen | B81C 1/00031 |
| | | | | 216/13 |
| 2010/0143849 | A1 | 6/2010 | Ema et al. | |
| 2013/0313223 | A1 * | 11/2013 | Fujikawa | B81C 1/00031 |
| | | | | 216/13 |
| 2015/0287592 | A1 * | 10/2015 | Park | G03F 7/0002 |
| | | | | 438/702 |

FOREIGN PATENT DOCUMENTS

| | | |
|---|---|---|
| JP | 2013-045908 | 3/2013 |
| JP | 2013-153084 | 8/2013 |
| JP | 2014-093385 | 5/2014 |

\* cited by examiner

*Primary Examiner* — Brian K Talbot
(74) *Attorney, Agent, or Firm* — Finnegan, Henderson, Farabow, Garrett & Dunner, L.L.P.

(57) ABSTRACT

A method of manufacturing a semiconductor device according to an embodiment includes forming a first interlayer film on a first layer, the first interlayer film containing a first molecule and a second molecule, and the first molecule and the second molecule being chemically bonded with each other. The method of manufacturing a semiconductor device includes phase-separating the first interlayer film. The method of manufacturing a semiconductor device includes forming a second layer on the phase-separated first interlayer film. The first molecule has a first affinity with the first layer and a second affinity with the second layer, the first affinity being larger than the second affinity. The second molecule has a third affinity with the second layer and a fourth affinity with the first layer, the third affinity being larger than the fourth affinity.

9 Claims, 12 Drawing Sheets

METHOD OF MANUFACTURING SEMICONDUCTOR DEVICE

CROSS-REFERENCE TO RELATED APPLICATION

This application is based upon and claims the benefit of priority from the prior Japanese Patent Application No. 2014-185304, filed on Sep. 11, 2014, the entire contents of which are incorporated herein by reference.

BACKGROUND

Field

Embodiments described herein relate generally to a o method of manufacturing a semiconductor device, and a semiconductor device.

Background Art

In an imprint lithography process, if the adhesive between a resist and a substrate is inadequate, a part of the resist adhering to a mold may be chipped off when the resist once cured is peeled off the mold.

According to a conventional method, an organic material that is easily chemically bonded with the resist is used as an adhesive film that bonds the resist and the substrate with each other. According to the method, materials that are easily bonded with each other are selected as the adhesive film and the resist.

In the imprint lithography process, however, many pattern defects of the resist are caused by inadequate adhesion between the adhesive film and the substrate (layer) to be processed.

DETAILED DESCRIPTION

A method of manufacturing a semiconductor device according to an embodiment includes forming a first interlayer film on a first layer, the first interlayer film containing a first molecule and a second molecule, and the first molecule and the second molecule being chemically bonded with each other. The method of manufacturing a semiconductor device includes phase-separating the first interlayer film. The method of manufacturing a semiconductor device includes forming a second layer on the phase-separated first interlayer film. The first molecule has a first affinity with the first layer and a second affinity with the second layer, the first affinity being larger than the second affinity. The second molecule has a third affinity with the second layer and a fourth affinity with the first layer, the third affinity being larger than the fourth affinity.

In the following, embodiments will be described with reference to the drawings.

First Embodiment

Figure 1:
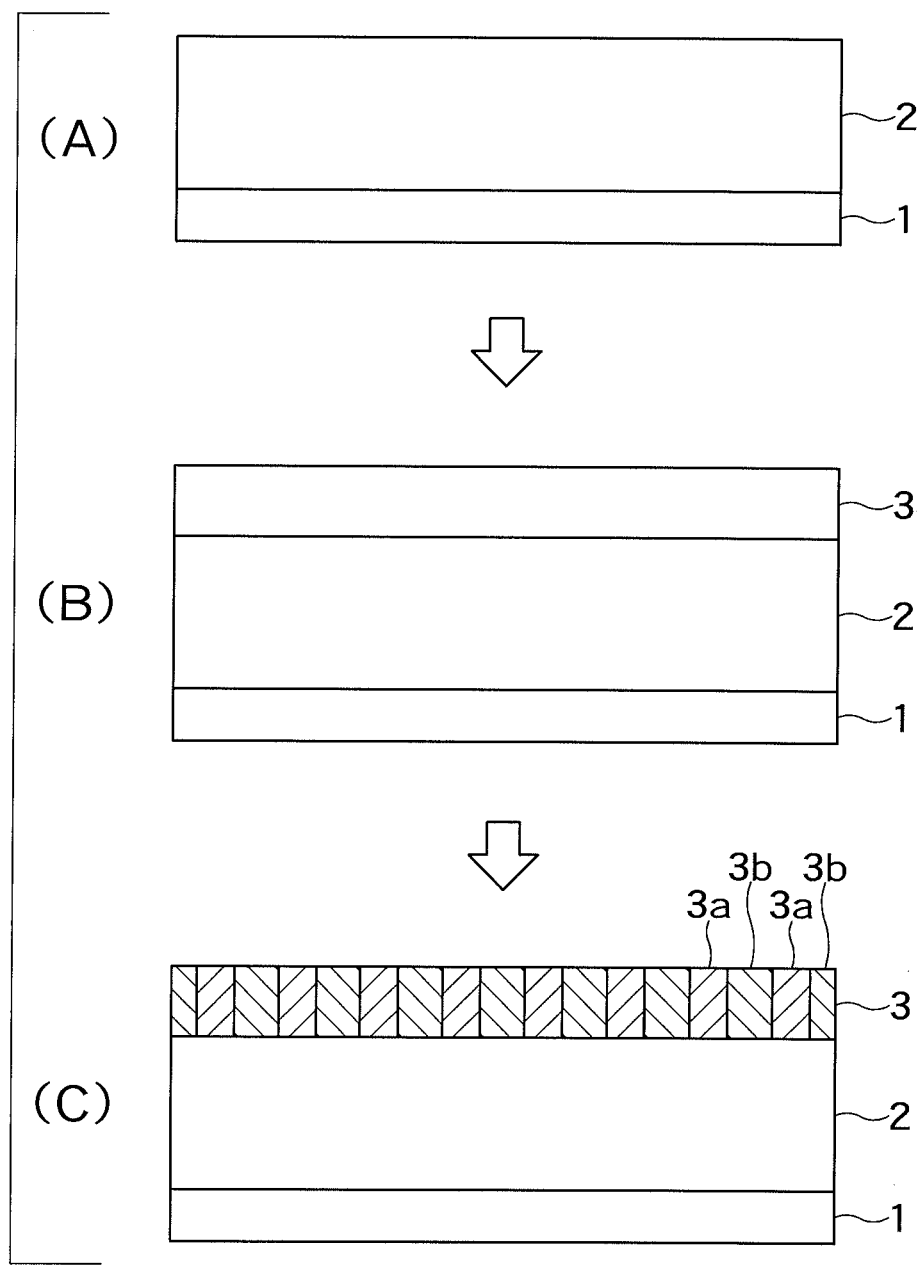
FIG. 1 is cross-sectional views showing an example of steps in a method of manufacturing a semiconductor device according to a first embodiment.
Figure 2:
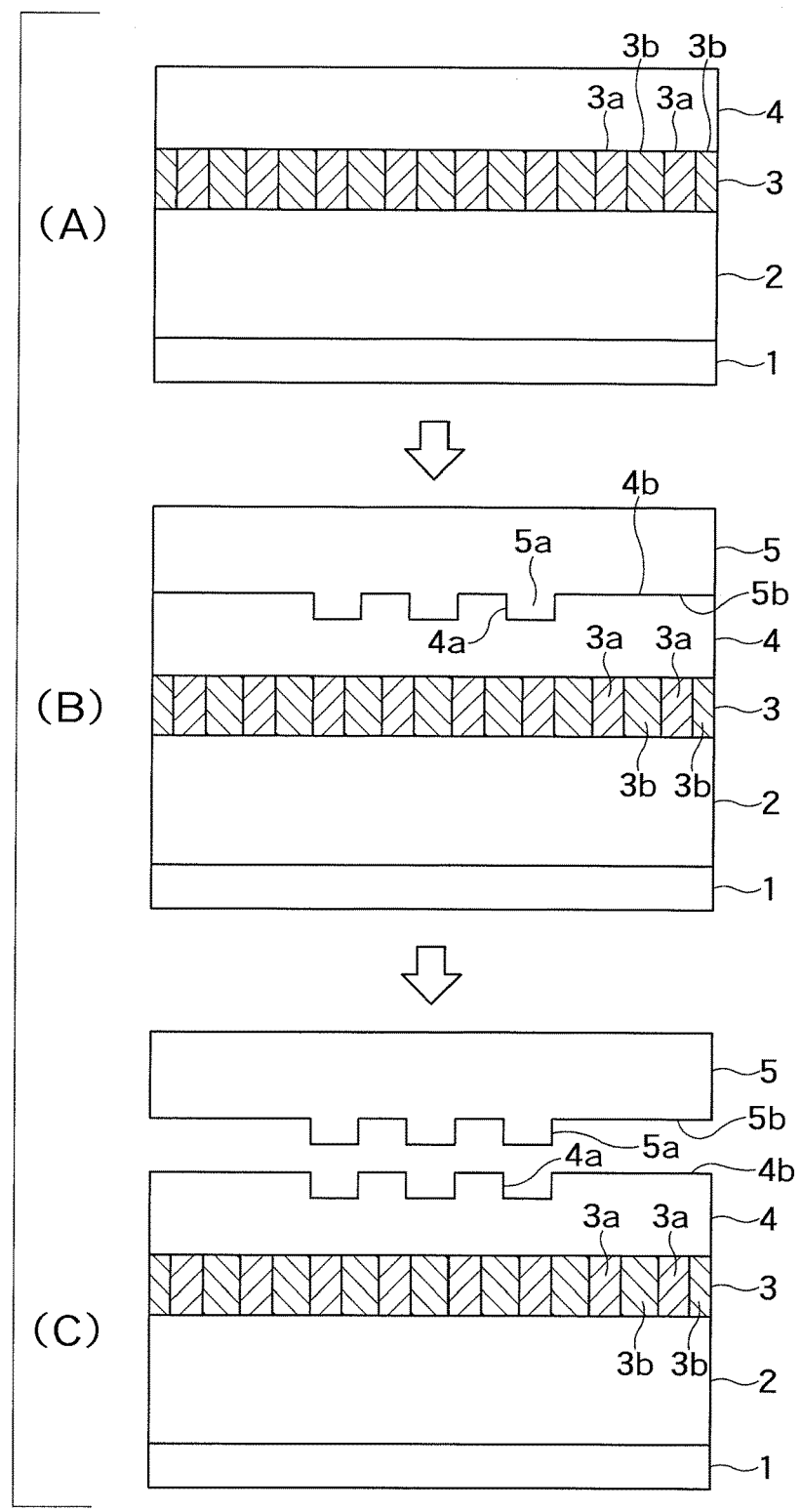
FIG. 2 is cross-sectional views showing an example of steps in a method of manufacturing a semiconductor device according to a first embodiment.
Figure 3:
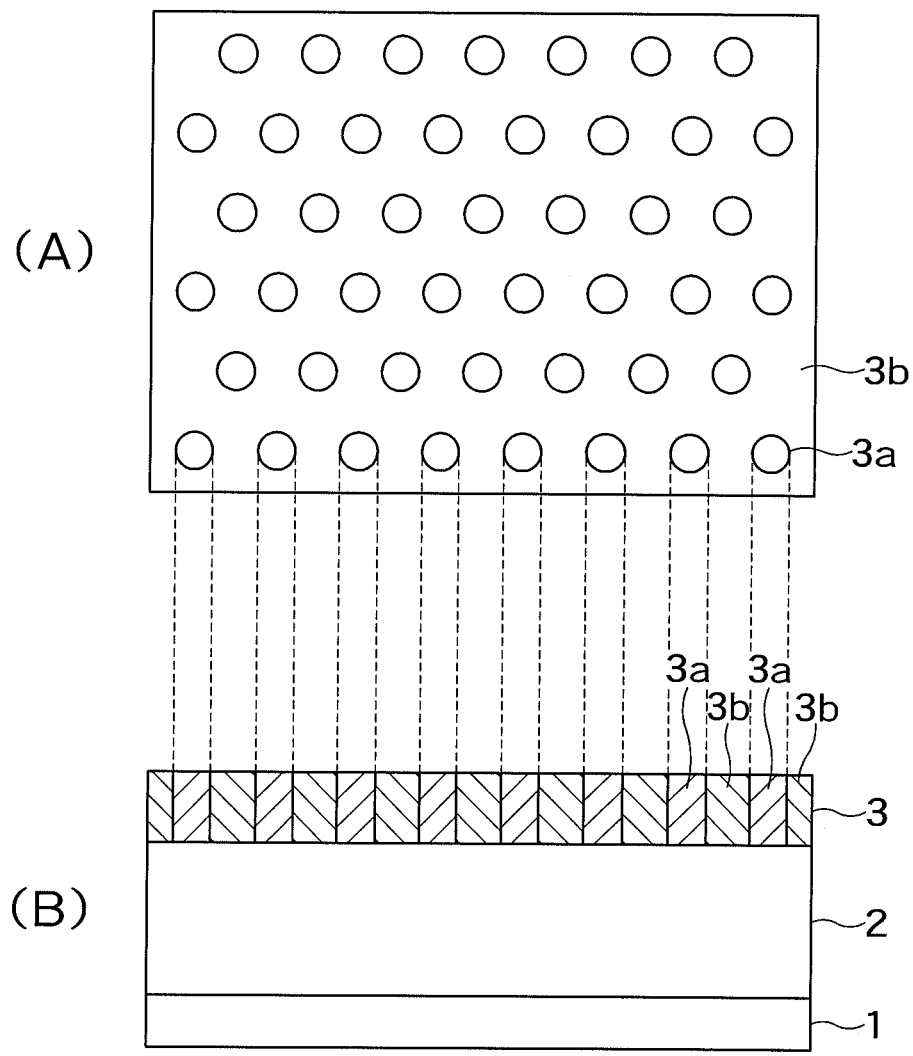
FIG. 3 is a top view (A) and a cross-sectional view (B) that show the step shown in FIG. 1(C) in a case where an adhesive film is phase-separated in a cylindrical structure.
Figure 4:
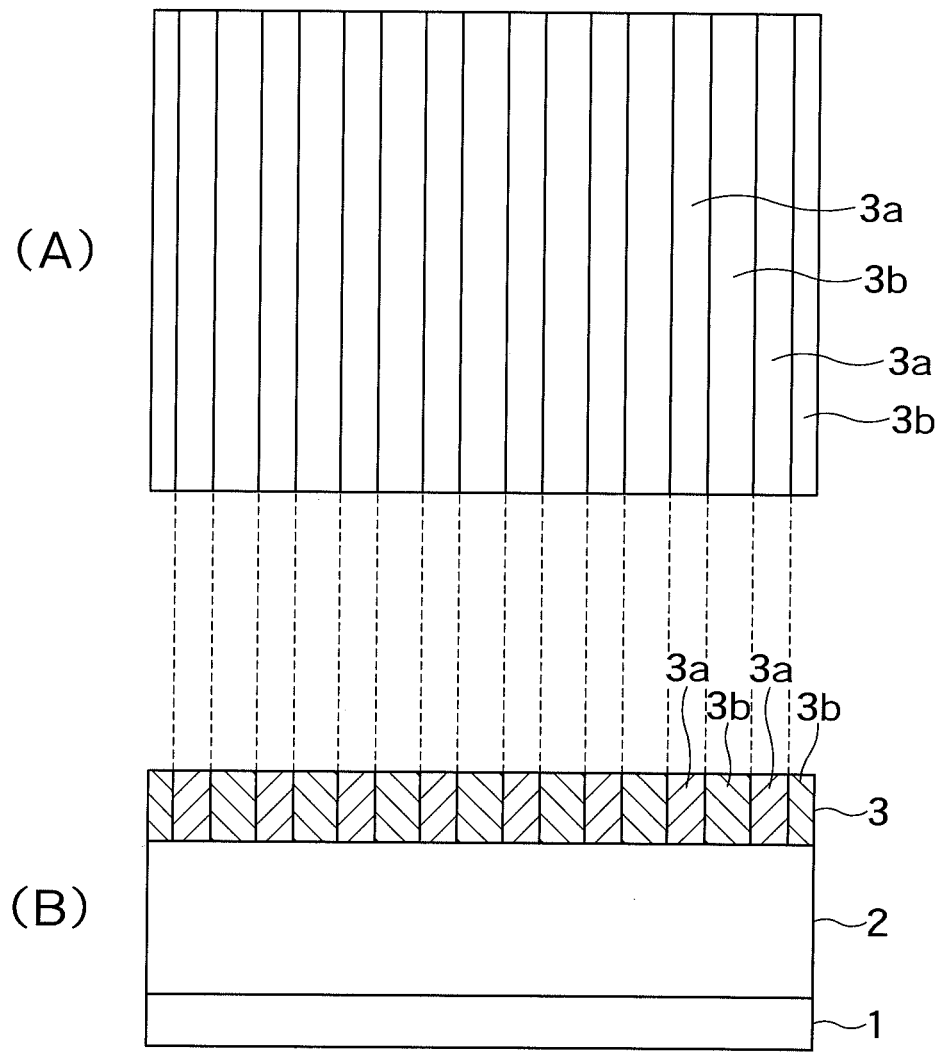
FIG. 4 is a top view (A) and a cross-sectional view (B) that show the step shown in FIG. 1(C) in a case where the adhesive film is phase-separated in a lamellar structure.

FIGS. 1 and 2 are cross-sectional views showing an example of steps in a method of manufacturing a semiconductor device according to a first embodiment. FIG. 3 is a top view (A) and a cross-sectional view (B) that show the step shown in FIG. 1(C) in a case where an adhesive film is phase-separated in a cylindrical structure. FIG. 4 is a top view (A) and a cross-sectional view (B) that show the step shown in FIG. 1(C) in a case where the adhesive film is phase-separated in a lamellar structure.

First, as shown in FIG. 1(A), a first layer 2 is formed on a substrate 1.

The first layer 2 is a spin-on-glass (SOG) film, for example. In this case, the first layer 2 is formed (deposited) on the substrate by spin coating.

The substrate 1 is made of a glass such as quartz glass, soda lime glass or borosilicate glass, a semiconductor such as silicon, silicon oxide, silicon nitride, gallium arsenide or gallium nitride, or a metal such as chromium, tantalum, aluminum, nickel, titanium, copper, iron, cobalt, tin, beryllium, gold, silver, platinum, palladium or amalgam, for example. The substrate 1 may have a desired pattern structure formed thereon, such as micro-wiring used for a semiconductor, a display or the like, a photonic crystal structure, a light waveguide, or an optical structure such as holographic structure.

The first layer 2 may not be made of a glass film such as the SOG film described above and can also be made of a semiconductor such as silicon, silicon oxide, silicon nitride, gallium arsenide or gallium nitride, a metal such as chromium, tantalum, aluminum, nickel, titanium, copper, iron, cobalt, tin, beryllium, gold, silver, platinum, palladium or amalgam or an organic polymer, or made of a low-dielectric film such as a Cu diffusion barrier film.

As shown in FIG. 1(B), an adhesive film (interlayer film) 3 is then formed (deposited) on the first layer 2 by spin coating, for example. The adhesive film 3 may be formed by vacuum deposition, chemical deposition, sputtering, spin coating, immersion coating, dipping or other process.

The adhesive film 3 is a self-assembly material in which molecules are aligned with each other when a phase separation occurs. For example, the adhesive film 3 is made of a diblock copolymer that is one of directed self-assembly (DSA) materials, which contains a first molecule and a second molecule, which are chemically bonded to each other.

Among other diblock copolymers, polystyrene-polymethylmethacrylate (PS-PMMA) is selected, for example. In this case, the first molecule is polystyrene, and the second molecule is polymethylmethacrylate.

The adhesive film 3 is not limited to the diblock copolymer described above and can be any block copolymer that is a macromolecule formed by a plurality of kinds of polymers bonded to each other. The block copolymer may be made of two, three or more kinds of polymers. Such polymers include polystyrene-polymethylmethacrylate (PS-PMMA), polystyrene-polyisoprene (PS-PI), polystyrene-polybutadiene (PS-PBD), polystytene-polyvynilpyridine (PS-PVP), polystyrene-polyethylene oxide (PS-PEO), polystyrene-polyethylene (PS-PE), polystyrene-organosilicate (PS-POS), polystyrene-polyferrocenyldimethylsilane (PS-PFS), polyethylene oxide-polyisoprene (PEO-PI), polyethylene oxide-polybutadiene (PEO-PBD), polyethylene oxide-polymethylmethacrylate (PEO-PMMA), polyethylene oxide-polyethylethylene (PEO-PEE), polybutadiene-polyvynilpyridine (PBD-PVD), polyisoprene-polymethylmethacrylate (PI-b-PMMA), polystyrene-polydimethylsiloxane (PS-PDMS), polystyrene-polysilsesquioxane (PS-PSSQ), polystyrene-polylactide (PS-PLA) and polylactide-silicone block copolymer (PLA-PDMS-PLA).

The block copolymer is preferably a combination of a plurality of kinds of polymers that are not compatible with each other. Such polymers may be polymers having a constitutional unit derived from a monomer having an aromatic ring. The monomer having an aromatic ring may be a monomer having a group formed by removing one hydrogen atom from an aromatic hydrocarbon ring such as a phenyl group, a biphenyl group, a fluorenyl group, a naphthyl group, an anthryl group or a phenanthryl group, or a heteroaryl group formed by replacing some of the carbon atoms of a ring of such a group with hetero atoms such as oxygen atoms, sulfur atoms or nitrogen atoms.

The block copolymer may be a block copolymer formed by bonding a polymer having a constitutional unit derived from a monitor having an aromatic ring and a polymer having (meth) acrylic ester as a constitutional unit, or a block copolymer formed by bonding a polymer having a constituent unit derived from a monitor having an aromatic ring and a polymer having siloxane or a derivative thereof as a constitutional unit, for example. Among others, the block copolymer is preferably a block copolymer formed by bonding a polymer having styrene or a derivative thereof as a constitutional unit and a polymer having (meth) acrylic ester as a constitutional unit, or a block copolymer formed by bonding a polymer having styrene or a derivative thereof as a constitutional unit and a polymer having siloxane or a derivative thereof as a constitutional unit.

Alternatively, the block copolymer may be a block copolymer of a fluorocarbon resin or a liquid crystal material.

As shown in FIG. 1(C), the adhesive film 3 is then phase-separated in a cylindrical (columnar) structure (FIG. 3). For example, the adhesive film 3 is phase-separated into a pattern 3a (first molecule) and a pattern 3b (second molecule) by a heating processing.

By changing the composition ratio or the like of the block copolymer of the adhesive film 3, the adhesive film 3 may be phase-separated in a lamellar pattern (FIG. 4).

As shown in FIG. 2(A), a second layer 4 is then formed on the phase-separated adhesive film 3. The second layer 4 is a resist layer, for example. The resist layer can be made of a photo-setting, thermosetting or thermoplastic resin material, for example.

As the first molecule of the adhesive film (diblock copolymer) 3 described above, a molecule that has an affinity (is larger than the affinity with the second layer 4) with the first layer 2 is selected. As the second molecule of the adhesive film 3, a molecule that has an affinity (is larger than the affinity with the first layer 2) with the second layer 4 is selected. A lower part of the pattern 3a (first molecule) and the pattern 3b (second molecule) of the phase-separated adhesive film 3 is in contact with an upper surface of the first layer 2, and an upper part of the pattern 3a (first molecule) and the pattern 3b (second molecule) is in contact with a lower surface of the second layer 4.

In this case, the lower part of the pattern 3a (first molecule) of the adhesive film 3 is chemically bonded with at least the first layer 2, and the upper part of the pattern 3b (second molecule) is chemically bonded with at least the second layer 4. Furthermore, the pattern 3a (first molecule) and the pattern 3b (second molecule) are chemically bonded with each other.

As shown in FIG. 2(B), a patterned surface 5b of a mold 5, on which a pattern 5a is formed, is brought into contact with (pressed against) an upper surface 4b of the second layer 4, thereby transferring the pattern of the mold 5 onto the upper surface 4b of the second layer 4.

As described above, the manufacturing method according to the present invention can be applied to an imprint lithography process to form a fine resist pattern on the second layer (resist layer) 4.

With the patterned surface 5b with the pattern 5a of the mold 5 formed thereon being kept in contact with the upper surface 4b of the second layer 4, the second layer 4 is then cured.

For example, when the second layer is made of a photo-setting resin material, the curing process can be achieved by irradiating the second layer with light from the side of the mold 5. When the second layer 4 is made of a thermosetting resin material, the thermosetting process can be performed on the second layer 4 while the mold 5 is being pressed against the second layer 4. When the second layer 4 is made of a thermoplastic resin material, the second layer 4 can be cured by letting the second layer 4 cool or cooling the second layer 4 while the mold 5 is being pressed against the second layer 4.

As shown in FIG. 2(C), the patterned surface 5b of the mold 5 is then peeled off the upper surface 4b of the cured second layer 4 having a transferred pattern 4a.

As described above, a molecule that has an affinity with the first layer 2 is selected as the first molecule of the adhesive film 3, and a molecule that has an affinity with the second layer 4 is selected as the second molecule of the adhesive film 3. In addition, the first molecule and the second molecule of the adhesive film 3 are chemically bonded with each other. The term "affinity" refers to a characteristic that no repulsion occurs, and does not necessarily involve a chemical bond. The adhesive strength can be increased by selecting the materials having an affinity with each other as described above and taking advantage of an anchor effect of the geometrical irregularities or the like.

In this way, the adhesion between the second layer (resist layer, for example) 4 and the adhesive film 3 is improved, and the adhesion between the substrate 1 (first layer 2) and the adhesive film 3 is improved.

That is, in the step of peeling the mold 5 off the cured second layer 4, the second layer 4 is firmly secured to the substrate 1 (first layer 2) by the adhesive film 3, so that the pattern 4a adhering to the mold 5 is prevented from being chipped off when the mold 5 is peeled off, and the pattern 4a can be formed on the second layer 4 with high precision.

After that, using the second layer 4 with the transferred pattern 4a as a mask, the first layer 2 is etched. In this way, a predetermined pattern is formed on the first layer 2.

Figure 5:
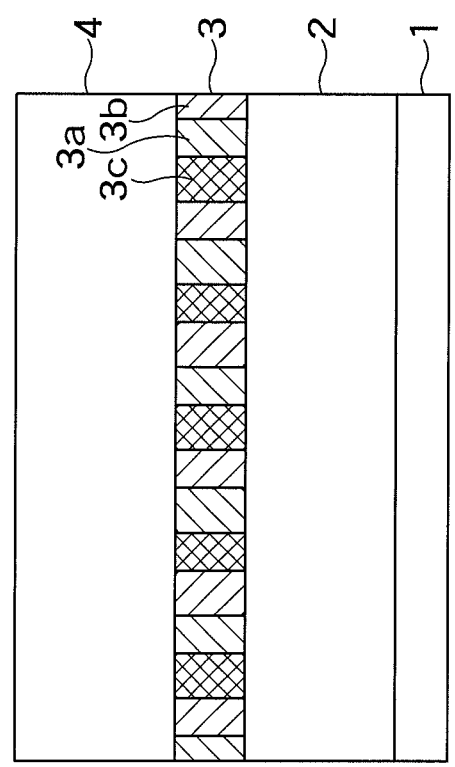
FIG. 5 is a cross-sectional view showing an example of a step after the adhesive film is phase-separated in a case where the adhesive film is made of a higher order block copolymer.

The adhesive film 3 may be a triblock or higher order block copolymer. FIG. 5 is a cross-sectional view showing an example of a step after the adhesive film is phase-separated in a case where the adhesive film is made of a higher order block copolymer.

As shown in FIG. 5, the adhesive film 3 is made of a triblock copolymer that is a DSA material, which contains a plurality of kinds of molecules (a first molecule 3a, a second molecule 3b and a third molecule 3c), and the plurality of kinds of molecules 3a, 3b and 3c are chemically bonded with each other.

Any of the plurality of kinds of molecules (first, second and third molecules 3a, 3b and 3c) is a molecule having an affinity (is larger than the affinity with the second layer 4) with the first layer 2, and any of the plurality of kinds of molecules (first, second and third molecules 3a, 3b and 3c) is a molecule having an affinity (Is larger than the affinity with the first layer 2) with the second layer 4.

In this case, again, the adhesion between the second layer (resist layer, for example) 4 and the adhesive film 3 can be improved, and the adhesion between the substrate 1 (first layer 2) and the adhesive film 3 can be improved.

As described above, the method of manufacturing a semiconductor device according to the first embodiment can increase the strength of adhesion between the substrate and the adhesive film.

Second Embodiment

A second embodiment will be described with regard to an example of the method of manufacturing a semiconductor device that increases the adhesion between the substrate (first layer) and the second layer by using the adhesive film and an additional adhesive film.

Figure 6:
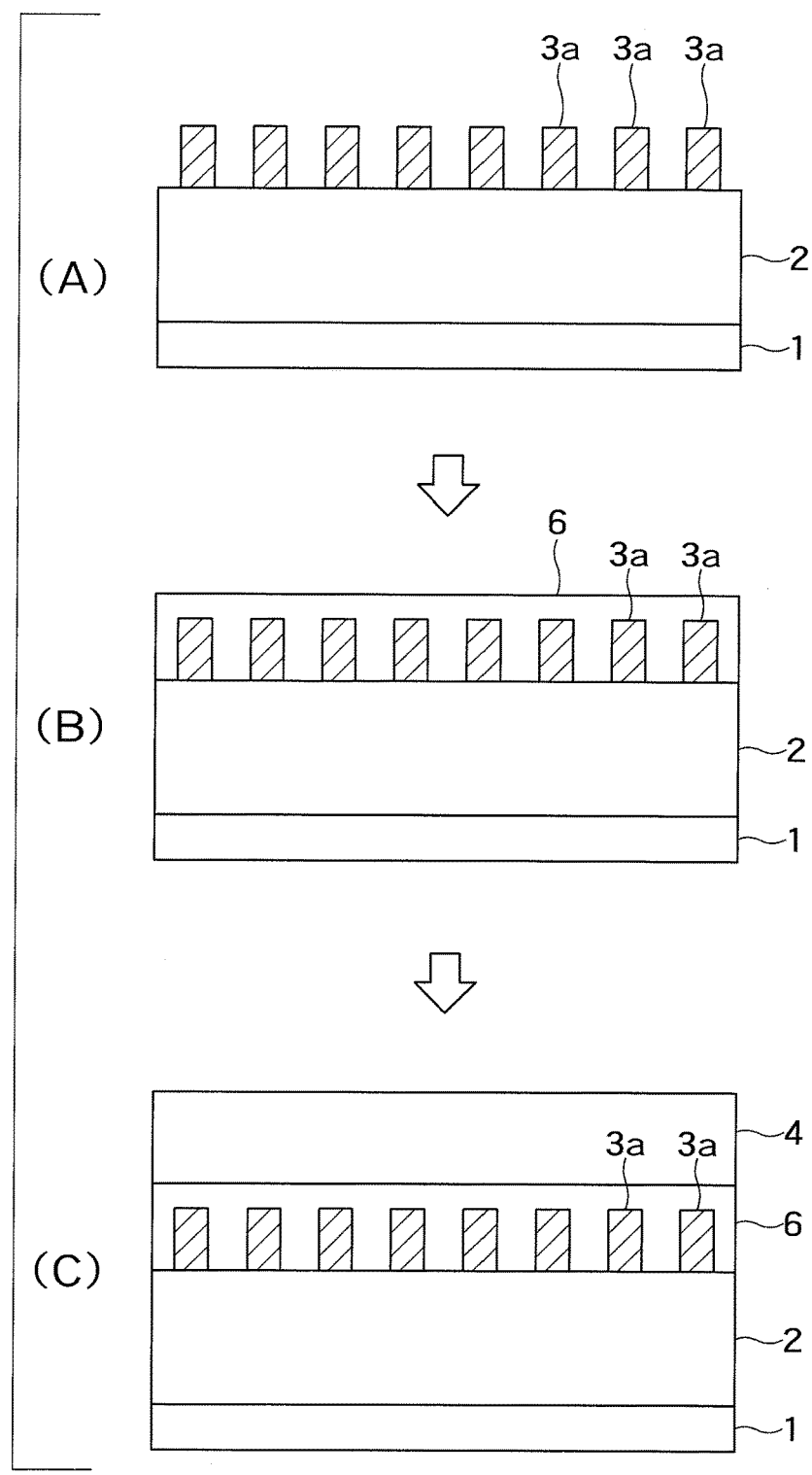
FIG. 6 is cross-sectional views showing an example of steps of the method of manufacturing a semiconductor device according to the second embodiment.
Figure 7:
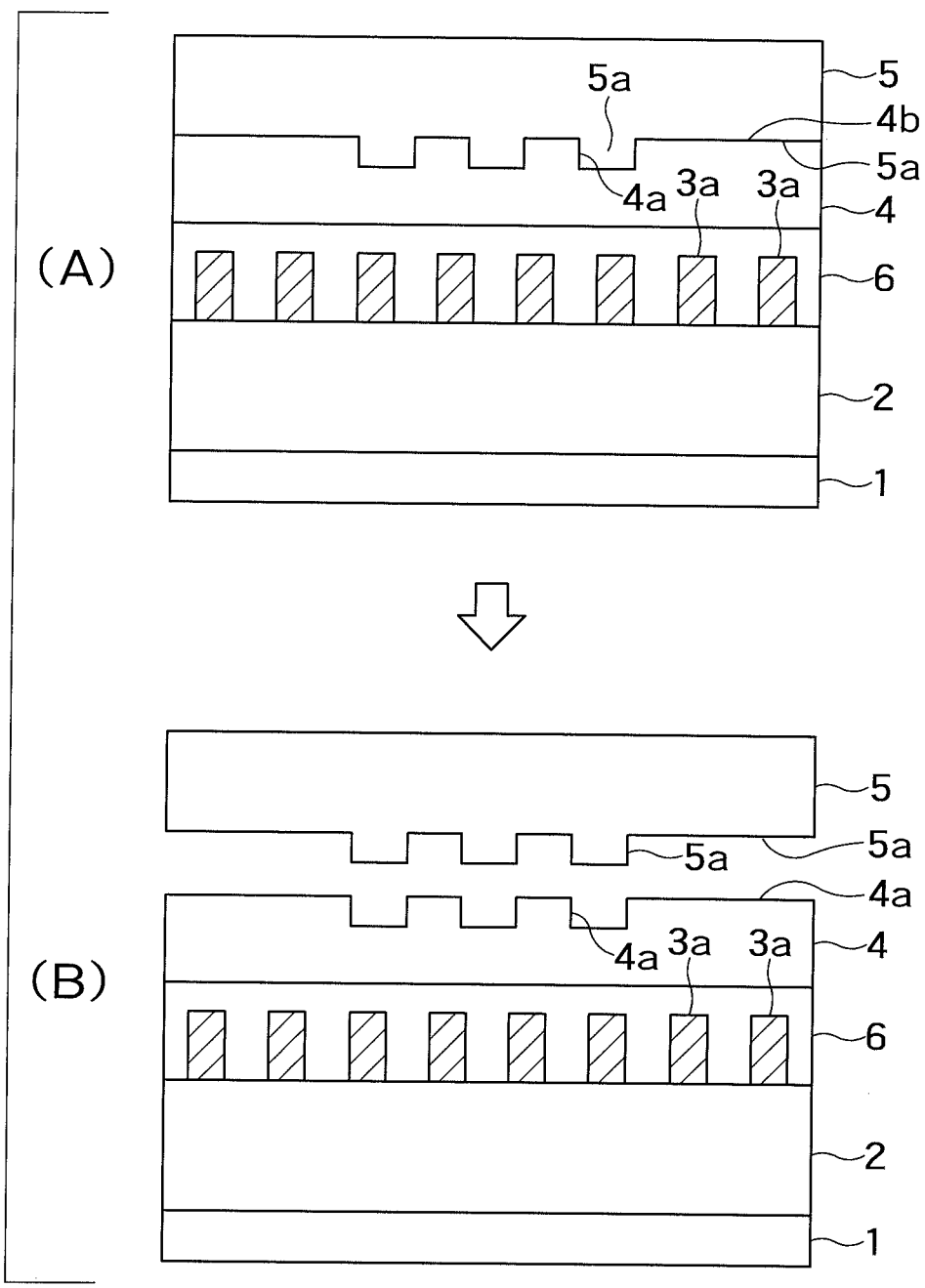
FIG. 7 is cross-sectional views showing an example of steps of the method of manufacturing a semiconductor device according to the second embodiment.

FIGS. 6 and 7 are cross-sectional views showing an example of steps of the method of manufacturing a semiconductor device according to the second embodiment. In FIGS. 6 and 7, the same reference numerals as those in FIGS. 1 and 2 denote the same components as those in the first embodiment.

First, as in the first embodiment, in the steps shown in FIGS. 1(A) to 1(C), the first layer 2 is formed on the substrate 1, the adhesive film (interlayer film) 3 is formed on the first layer 2, and the adhesive film 3 is phase-separated in a cylindrical structure (FIG. 3) or a lamellar structure (FIG. 4).

As shown in FIG. 6(A), the pattern 3b (second molecule) is then selectively removed from the phase-separated adhesive film 3. For example, the second molecule is selectively removed from the phase-separated adhesive film 3 by wet etching the second molecule of the adhesive film 3.

As shown in FIG. 6(B), an adhesive film (Interlayer film) 6 is then formed on the adhesive film 3 from which the second molecule 3b has been removed (that is, the adhesive film 3 on which only the pattern 3a (first molecule) remains) by spin coating, for example, in such a manner that the adhesive film 6 sufficiently covers the pattern 3a of the adhesive film 3. The adhesive film 6 is made of an adhesive, for example.

As shown in FIG. 6(C), the second layer 4 is then formed on the adhesive film 6.

As shown in FIG. 7(A), the patterned surface 5b of the mold 5, on which the pattern 5a is formed, is brought into contact with (pressed against) the upper surface 4b of the second layer 4, thereby transferring the pattern of the mold 5 onto the upper surface 4b of the second layer 4.

With the patterned surface 5b with the pattern 5a of the mold 5 formed thereon being kept in contact with the upper surface 4b of the second layer 4, the second layer 4 is then cured.

As shown in FIG. 7(B), the patterned surface 5b of the mold 5 is then peeled off the upper surface 4b of the cured second layer 4 having the transferred pattern 4a.

A molecule that has an affinity (is larger than the affinity with the second layer 4) with the first layer 2 is selected as the first molecule of the adhesive film (diblock copolymer) 3 described above. In addition, as the adhesive film 6, an adhesive film that has an affinity (is larger than the affinity with the first layer 2) with the pattern 3a (first molecule) of the adhesive film 3 and the second layer 4 is selected. More preferably, an adhesive film that further has an affinity with the first layer 2 is selected as the adhesive film 6.

The lower part of the pattern 3a (first molecule) of the phase-separated adhesive film 3 is in contact with the upper surface of the first layer 2. In addition, an upper part and a side surface of the pattern 3a and a part of the upper surface of the first layer 2 are in contact with the adhesive film 6.

In this case, the lower part of the pattern 3a (first molecule) of the adhesive film 3 is chemically bonded with the first layer 2. In addition, the upper part and the side surface of the pattern 3a and the above-described part of the upper surface of the first layer 2 are chemically bonded with the adhesive film 6. In addition, an upper part of the adhesive film 6 and the second layer 4 are chemically bonded with each other.

In this way, the adhesion between the adhesive film 6 bonded with the second layer 4 and the adhesive film 3 is improved, and the adhesion between the substrate 1 (first layer 2) and the adhesive film 3 and adhesive film 6 is improved.

That is, as in the first embodiment, in the step of peeling the mold 5 off the cured second layer 4, the second layer 4 is firmly secured to the substrate 1 (first layer 2) by the adhesive film 3, so that the pattern 4a adhering to the mold 5 is prevented from being chipped off when the mold 5 is peeled off, and the pattern 4a of the second layer 4 can be formed with high precision.

After that, using the second layer 4 with the transferred pattern 4a as a mask, the first layer 2 is etched. In this way, a predetermined pattern is formed on the first layer 2.

As in the first embodiment, the adhesive film 3 may be a triblock or higher order block copolymer.

As described above, the method of manufacturing a semiconductor device according to the second embodiment can increase the strength of adhesion between the substrate and the adhesive film.

Third Embodiment

A third embodiment will be described with regard to an example of the method of manufacturing a semiconductor device that increases the adhesion between the substrate (first layer) and the second layer by using an additional adhesive film.

Figure 8:
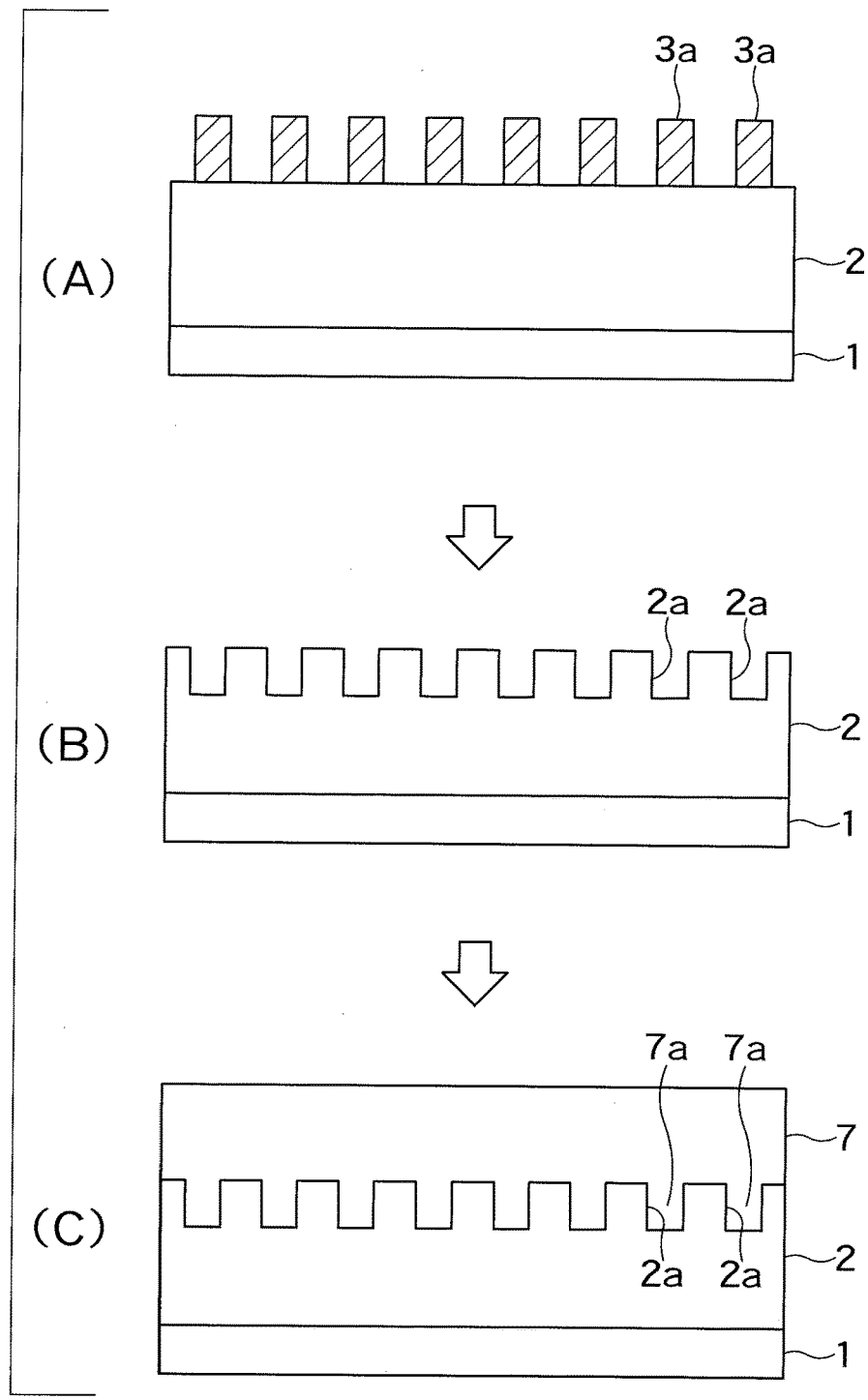
FIG. 8 is cross-sectional views showing an example of steps of the method of manufacturing a semiconductor device according to the third embodiment.
Figure 9:
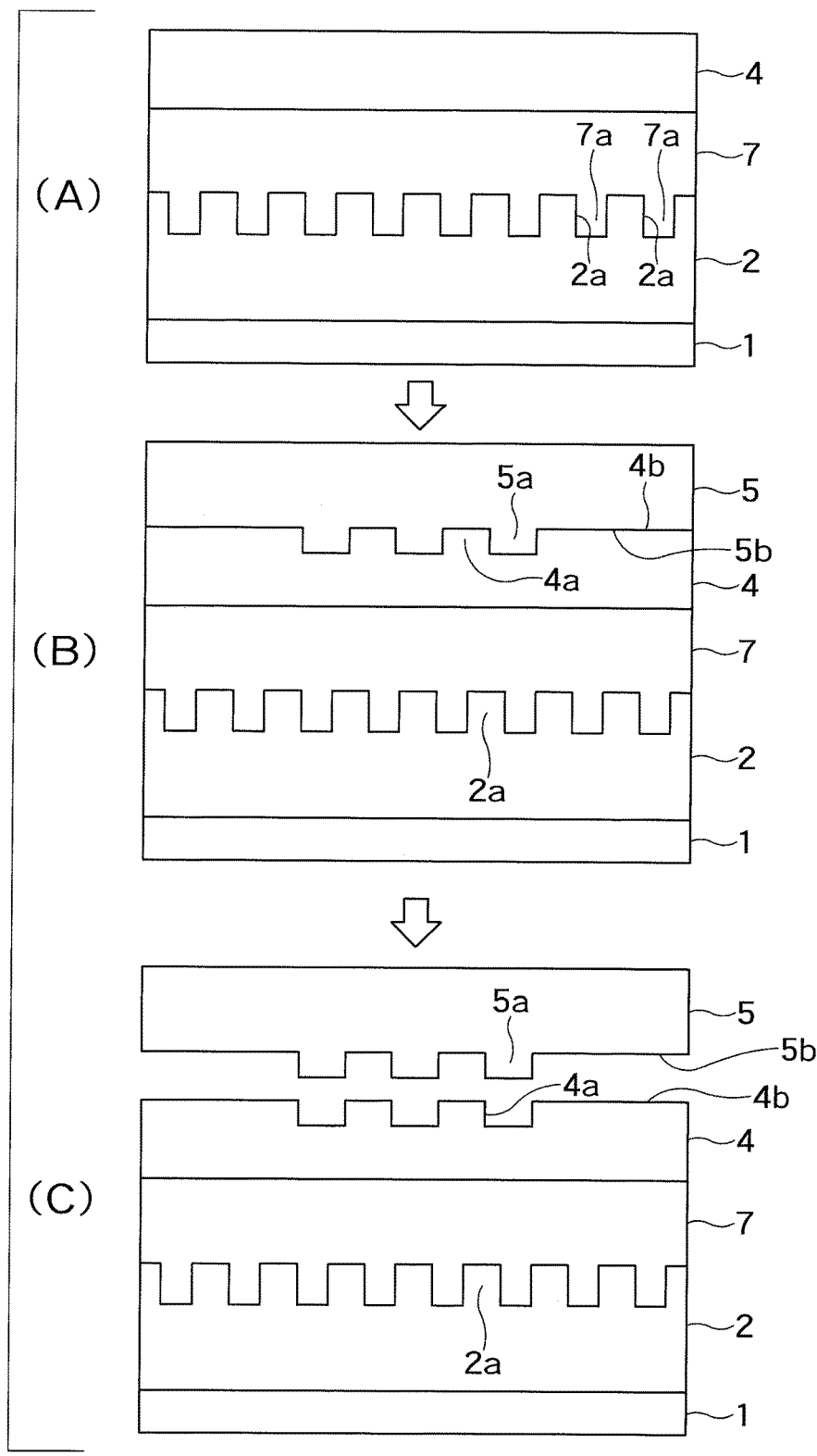
FIG. 9 is cross-sectional views showing an example of steps of the method of manufacturing a semiconductor device according to the third embodiment.

FIGS. 8 and 9 are cross-sectional views showing an example of steps of the method of manufacturing a semiconductor device according to the third embodiment. In FIGS. 8 and 9, the same reference numerals as those in FIGS. 6 and 7 denote the same components as those in the second embodiment.

First, as in the first embodiment, in the steps shown in FIGS. 1(A) to 1(C), the first layer 2 is formed on the substrate 1, the adhesive film 3 is formed on the first layer 2, and the adhesive film 3 is phase-separated in a cylindrical structure (FIG. 3) or a lamellar structure (FIG. 4).

As shown in FIG. 8(A), the pattern 3b (second molecule) is then selectively removed from the phase-separated adhesive film 3. For example, the second molecule is selectively removed from the phase-separated adhesive film 3 by wet etching the second molecule of the adhesive film 3.

Using the adhesive film from which the second molecule has been removed as a mask, the upper surface of the first layer 2 is etched (by dry etching, such as reactive ion etching (RIE), for example). After the etching of the upper surface of the first layer 2, as shown in FIG. 8(B), the adhesive film 3 (pattern 3a) is removed.

After the adhesive film 3 is removed, as shown in FIG. 8(C), an adhesive film 7 is formed on the etched first layer 2 by spin coating, for example. The adhesive film 7 is made of an adhesive, for example.

As shown in FIG. 9(A), the second layer 4 is then formed on the adhesive film 7.

As shown in FIG. 9(B), the patterned surface 5b of the mold 5, on which the pattern 5a is formed, is brought into contact with (pressed against) the upper surface 4b of the second layer 4, thereby transferring the pattern of the mold 5 onto the upper surface 4b of the second layer 4.

With the patterned surface 5b with the pattern 5a of the mold 5 formed thereon being kept in contact with the upper surface 4b of the second layer 4, the second layer 4 is then cured.

As shown in FIG. 9(C), the patterned surface 5b of the mold 5 is then peeled off the upper surface 4b of the cured second layer 4 having the transferred pattern 4a.

Since a fine pattern 2a (geometrical irregularities) is formed on the first layer 2 as described above, the area of adhesion between the first layer 2 and the adhesive film 7 is increased. Therefore, the adhesion between the first layer 2 (substrate 1) and the adhesive film 7 is improved. That is, the adhesion of the adhesive film 7 is improved.

In this way, the adhesion between the adhesive film 7 bonded with the second layer 4 and the adhesive film 3 is improved, and the adhesion between the substrate (first layer 2) and the adhesive films 3 and 7 is improved.

That is, as in the first embodiment, in the step of peeling the mold 5 off the cured second layer 4, the second layer 4 is firmly secured to the substrate 1 (first layer 2) by the adhesive film 7, so that the pattern 4a adhering to the mold 5 is prevented from being chipped off when the mold 5 is peeled off, and the pattern 4a of the second layer 4 can be formed with high precision.

After that, using the second layer 4 with the transferred pattern 4a as a mask, the first layer 2 is etched. In this way, a predetermined pattern is formed on the first layer 2.

That is, the method of manufacturing a semiconductor device according to the third embodiment can increase the strength of adhesion between the substrate and the adhesive film.

The method of manufacturing a semiconductor device according to this embodiment can be applied not only to a lithography process but also a semiconductor lamination process.

Fourth Embodiment

A fourth embodiment will be described with regard to an example of the method of manufacturing a semiconductor device that increases the adhesion between the substrate (first layer) and the second layer by using an additional adhesive film.

Figure 10:
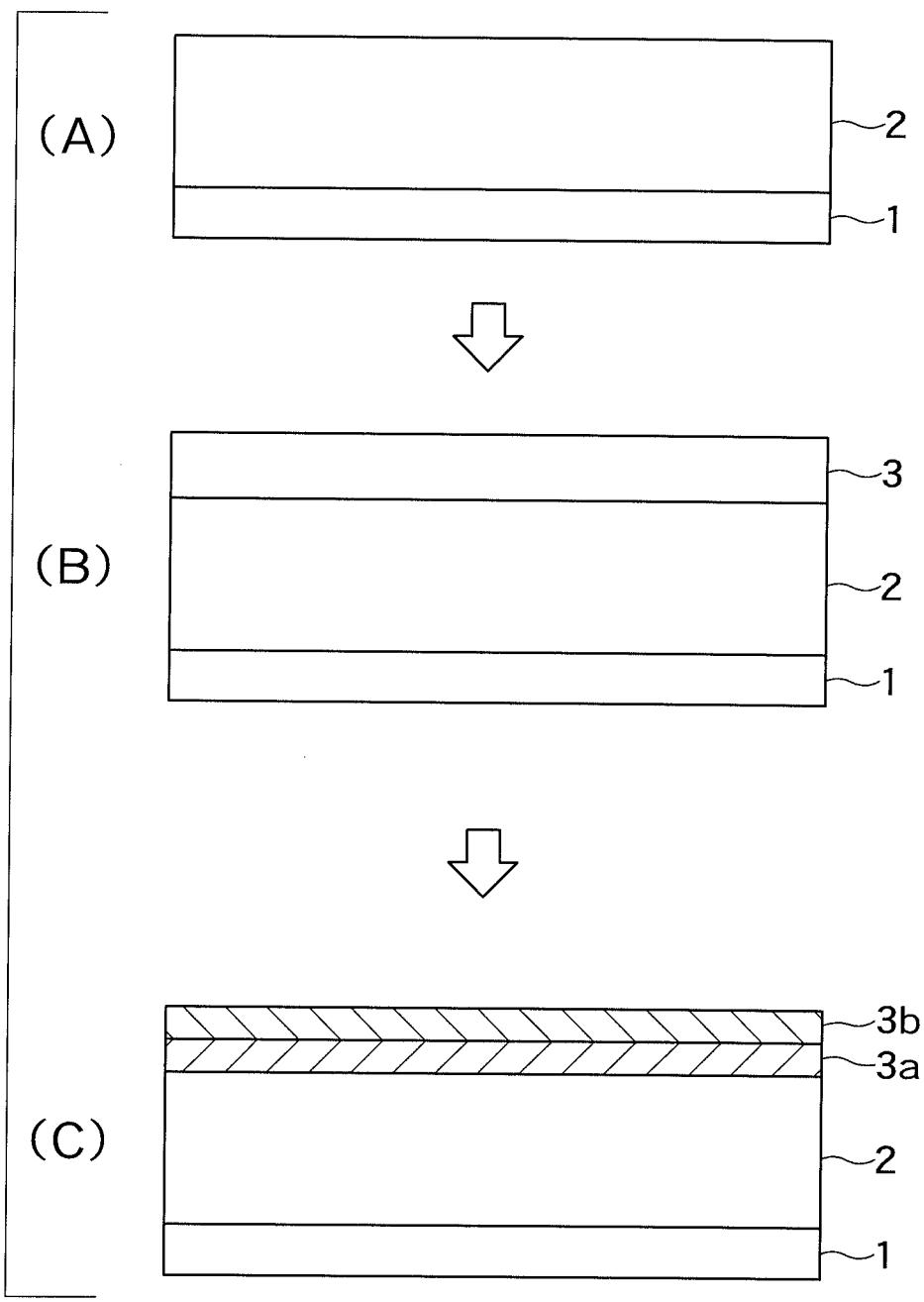
FIG. 10 is cross-sectional views showing an example of steps of the method of manufacturing a semiconductor device according to the fourth embodiment.
Figure 11:
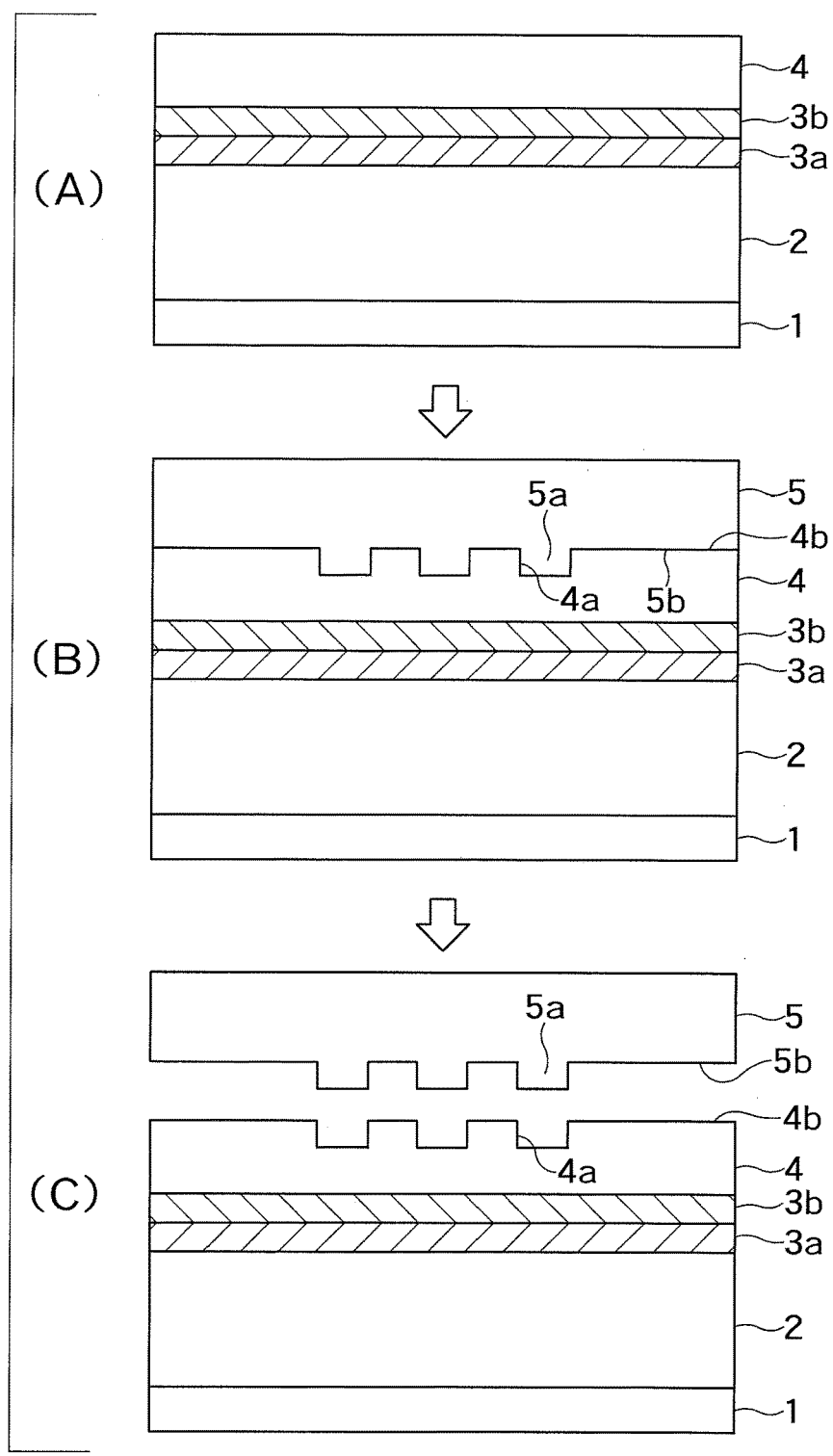
FIG. 11 is cross-sectional views showing an example of steps of the method of manufacturing a semiconductor device according to the fourth embodiment.

FIGS. 10 and 11 are cross-sectional views showing an example of steps of the method of manufacturing a semiconductor device according to the fourth embodiment. In FIGS. 10 and 11, the same reference numerals as those in FIGS. 1 and 2 denote the same components as those in the first embodiment.

First, as shown in FIG. 10(A), the first layer 2 is formed on the substrate 1.

As shown in FIG. 10(B), the adhesive film 3 is then formed (deposited) on the first layer 2 by spin coating, for example.

As shown in FIG. 10(C), the adhesive film 3 is then phase-separated. For example, the adhesive film 3 is phase-separated by a heating processing.

In this embodiment, in particular, the adhesive film 3 is phase-separated so that the pattern 3a (first molecule) is positioned on the side of the first layer 2 and bonded with the upper surface of the first layer 2, and the pattern 3b (second molecule) is positioned on the side of the second layer 4 and bonded with the lower surface of the second layer 4. That is, the adhesive film 3 is phase-separated in a direction parallel to the upper surface of the first layer 2 (substrate 1).

In this case, the lower part of the pattern 3a (first molecule) of the adhesive film 3 is chemically bonded with the first layer 2, and the upper part of the pattern 3b (second molecule) is chemically bonded with the second layer 4. In addition, the pattern 3a (first molecule) and the pattern 3b (second molecule) are chemically bonded with each other. These chemical bonds increase the adhesion between the second layer 4 and the adhesive film 3 and the adhesion between the substrate 1 (first layer 2) and the adhesive film 3.

As shown in FIG. 11(A), the second layer 4 is then formed on the phase-separated adhesive film 3.

As shown in FIG. 11(B), the patterned surface 5b of the mold 5, on which the pattern 5a is formed, is brought into contact with (pressed against) the upper surface 4b of the second layer 4, thereby transferring the pattern of the mold 5 onto the upper surface 4b of the second layer 4.

With the patterned surface 5b with the pattern 5a of the mold 5 formed thereon being kept in contact with the upper surface 4b of the second layer 4, the second layer 4 is then cured.

As shown in FIG. 11(C), the patterned surface 5b of the mold 5 is then peeled off the upper surface 4b of the cured second layer 4 having the transferred pattern 4a.

Thus, as described above, the adhesion between the second layer 4 and the adhesive film 3 is improved, and the adhesion between the substrate 1 (first layer 2) and the adhesive film 3 is improved.

That is, as in the first embodiment, in the step of peeling the mold 5 off the cured second layer 4, the second layer 4 is firmly secured to the substrate 1 (first layer 2) by the adhesive film 7, so that the pattern 4a adhering to the mold 5 is prevented from being chipped off when the mold 5 is peeled off, and the pattern 4a of the second layer 4 can be formed with high precision.

After that, using the second layer 4 with the transferred pattern 4a as a mask, the first layer 2 is etched. In this way, a predetermined pattern is formed on the first layer 2.

Figure 12:
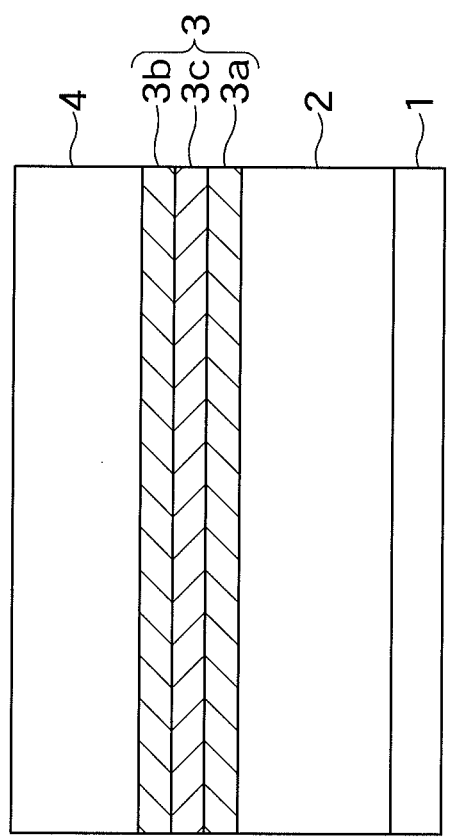
FIG. 12 is a cross-sectional view showing an example of a step after the adhesive film is phase-separated in a case where the adhesive film is made of a higher order block copolymer.

The adhesive film 3 may be a triblock or higher order block copolymer. FIG. 12 is a cross-sectional view showing an example of a step after the adhesive film is phase-separated in a case where the adhesive film is made of a higher order block copolymer.

As shown in FIG. 12, the adhesive film 3 is made of a triblock copolymer that is a DSA material, which contains a plurality of kinds of molecules (a first molecule 3a, a second molecule 3b and a third molecule 3c), and the plurality of kinds of molecules 3a, 3b and 3c are chemically bonded with each other.

Any of the plurality of kinds of molecules (first, second and third molecules 3a, 3b and 3c) is a molecule having an affinity (is larger than the affinity with the second layer 4) with the first layer 2, and any of the plurality of kinds of molecules (first, second and third molecules 3a, 3b and 3c) is a molecule having an affinity (is larger than the affinity with the first layer 2) with the second layer 4.

In the example shown in FIG. 12, of the plurality of kinds of molecules (first, second and third molecules 3a, 3b and 3c), the first molecule 3a has an affinity (is larger than the affinity with the second layer 4) with the first layer 2, and the second molecule 3b has an affinity (is larger than the affinity with the first layer 2) with the second layer 4.

In this case, again, the adhesion between the second layer (resist layer, for example) 4 and the adhesive film 3 can be improved, and the adhesion between the substrate 1 (first layer 2) and the adhesive film 3 can be improved.

That is, the method of manufacturing a semiconductor device according to the fourth embodiment can increase the strength of adhesion between the substrate and the adhesive film.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a first interlayer film on a first layer as an adhesive film, the first interlayer film containing a first molecule and a second molecule, and the first molecule and the second molecule being chemically bonded with each other;
    phase-separating the first interlayer film, in which the first molecule and the second molecule are aligned with each other;
    forming a second layer on the phase-separated first interlayer film;
    contacting a patterned surface of a mold to transfer the pattern of the mold onto an upper surface of the second layer;
    peeling the patterned surface of the mold off the upper surface of the second layer having the pattern transferred thereon; and
    etching the first layer by only using the second layer as a mask,
    wherein the first molecule has a first affinity with the first layer and a second affinity with the second layer and is chemically bonded with an upper surface of the first layer, the first affinity being larger than the second affinity, and
    the second molecule has a third affinity with the second layer and a fourth affinity with the first layer and is chemically bonded with a lower surface of the second layer, the third affinity being larger than the fourth affinity.

2. The method of manufacturing a semiconductor device according to claim 1, wherein the second layer is formed on the phase-separated first interlayer film after phase-separating the first interlayer film by heating the first interlayer film.

3. The method of manufacturing a semiconductor device according to claim 2, wherein the first interlayer film is phase-separated in a lamellar structure or a cylindrical structure by heating the first interlayer film.

4. The method of manufacturing a semiconductor device according to claim 3, wherein the first molecule is positioned on the side of the first layer and the second molecule is positioned on the side of the second layer.

5. The method of manufacturing a semiconductor device according to claim 3, wherein the contacting of the patterned surface includes:
    bringing the patterned surface of the mold, on which the pattern is formed, into contact with the upper surface of the second layer to transfer the pattern of the mold onto the upper surface of the second layer; and
    curing the second layer.

6. The method of manufacturing a semiconductor device according to claim 1, wherein the first interlayer film is a self-assembly material in which molecules are aligned with each other when a phase separation occurs.

7. The method of manufacturing a semiconductor device according to claim 6, wherein the first interlayer film is made of a diblock copolymer.

8. The method of manufacturing a semiconductor device according to claim 7, wherein the diblock copolymer is polystyrene-polymethylmethacrylate, the first molecule is polystyrene, and the second molecule is polymethylmethacrylate.

9. The method of manufacturing a semiconductor device according to claim 3, wherein the second layer is a resist layer.

* * * * *